United States Patent
Tsuruya et al.

(10) Patent No.: US 10,896,700 B2
(45) Date of Patent: Jan. 19, 2021

(54) CONTROL METHOD OF ENVIRONMENTAL TEMPERATURE OF STORAGE DRIVE

(71) Applicant: Hitachi, Ltd., Tokyo (JP)

(72) Inventors: Masahiro Tsuruya, Tokyo (JP); Masahiro Arai, Tokyo (JP); Akifumi Suzuki, Tokyo (JP); Shimpei Nomura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 92 days.

(21) Appl. No.: 16/329,657

(22) PCT Filed: Apr. 19, 2017

(86) PCT No.: PCT/JP2017/015739
§ 371 (c)(1),
(2) Date: Feb. 28, 2019

(87) PCT Pub. No.: WO2018/193556
PCT Pub. Date: Oct. 25, 2018

(65) Prior Publication Data
US 2019/0198063 A1 Jun. 27, 2019

(51) Int. Cl.
*G11C 7/04* (2006.01)
*G11C 16/26* (2006.01)
*G06F 12/16* (2006.01)
*G11C 11/56* (2006.01)
*G11C 16/34* (2006.01)

(52) U.S. Cl.
CPC .............. *G11C 7/04* (2013.01); *G06F 12/16* (2013.01); *G11C 11/5628* (2013.01); *G11C 16/26* (2013.01); *G11C 16/349* (2013.01); *G11C 16/3418* (2013.01)

(58) Field of Classification Search
CPC .. G06F 11/3034; G06F 11/3058; G06F 12/16; G11C 11/5628; G11C 16/26; G11C 16/3418; G11C 16/349; G11C 7/04
See application file for complete search history.

(56) References Cited

U.S. PATENT DOCUMENTS

| | | | | |
|---|---|---|---|---|
| 2002/0066001 A1* | 5/2002 | Olarig | ................. | G06F 13/1694 711/170 |
| 2014/0343748 A1* | 11/2014 | Suzuki | .................... | G06F 1/206 700/300 |
| 2015/0092488 A1 | 4/2015 | Wakchaure et al. | | |

FOREIGN PATENT DOCUMENTS

WO   2013/124880 A1   8/2013

* cited by examiner

*Primary Examiner* — Chad G Erdman
(74) *Attorney, Agent, or Firm* — Procopio, Cory, Hargreaves & Savtich LLP

(57) ABSTRACT

A system including a first storage drive and a superior device superior to the first storage drive, wherein the superior device specifies a first allowable environmental temperature that makes the remaining lifetime of the first storage drive longer than the remaining operation schedule period of the first storage drive, and controls an environmental temperature adjusting device that adjusts the environmental temperature of the first storage drive on the basis of the first allowable environmental temperature.

13 Claims, 15 Drawing Sheets

PROGRAM AREA
- TCO REDUCTION PROGRAM — 503
- SERVER/STORAGE COMMUNICATION PROGRAM — 504
- AIR CONDITION MANAGEMENT TERMINAL COMMUNICATION PROGRAM — 505
- USER COMMUNICATION PROGRAM — 506

502

TBL AREA
- COOLING POWER COST TBL — 507
- SSD REPLACEMENT COST TBL — 508
- APPARATUS INFORMATION TBL — 509

MAIN MEMORY

| EXTERNAL CONDITION | SETTING TEMPERATURE | COOLING POWER FOR APPARATUS POWER CONSUMPTION |
|---|---|---|
| A | 10°C | 1.50 $/Wh |
| B | 10°C | 1.55 $/Wh |
| ... | ... | ... |
| X | 25°C | 1.20 $/Wh |
| ... | ... | ... |

COOLING POWER COST TBL

FIG.7

| APPARATUS MODEL | REPLACEMENT COST |
|---|---|
| A | $10,000 |
| B | $15,000 |
| C | $20,000 |
| ... | ... |

SSD REPLACEMENT COST TBL

FIG.8

| APPARATUS ID (801) | APPARATUS MODEL (802) | OPERATION START DATE AND TIME (803) | OPERATION SCHEDULE PERIOD (804) |
|---|---|---|---|
| 0 | SERVER A | 170101 09:00:00 | 26.280 h |
| 1 | SERVER A | 170115 12:00:00 | 26.280 h |
| 2 | STORAGE X | 170101 06:00:00 | 43,800 h |
| ... | ... | ... | ... |

APPARATUS INFORMATION TBL (509)

| MANAGEMENT # | STATE | LIFETIME INFORMATION |
|---|---|---|
| 0 | NORMAL | xxxx |
| 1 | FAULTY | ... |
| 2 | NORMAL | yyyy |
| ... | ... | ... |

FM INFORMATION TBL

FIG.13

| GENERATION # | UPDATE DATE AND TIME | ENVIRONMENTAL TEMPERATURE | TOTAL WRITING VOLUME INTO FMS | DEVICE REMAINING LIFETIME FOR EACH ENVIRONMENTAL TEMPERATURE |
|---|---|---|---|---|
| 0 | 170101 00:00:00 | 22°C | 0 GB | 10°C : xxxx h<br>11°C : yyyy h<br>... |
| 1 | A | 22°C | X GB | $\alpha$ |
| ... | ... | ... | ... | ... |
| N | B | 32°C | Y GB | $\beta$ |
| ... | ... | ... | ... | ... |

HISTORY INFORMATION TBL

FIG.14

| # | ITEM NAME | VALUE |
|---|---|---|
| 1401 — 0 | DEVICE CAPACITY | 1,000 GB |
| 1402 — 1 | MOUNTED FLASH MEMORY CAPACITY | 1,280 GB |
| 1403 — 2 | REFERENCE LIFETIME OF FLASH MEMORY | xxxx |
| 1404 — 3 | REFERENCE ENVIRONMENTAL TEMPERATURE | 25°C |
| 1405 — 4 | HIGHEST ALLOWABLE ENVIRONMENTAL TEMPERATURE | 60°C |
| 1406 — 5 | LOWEST ALLOWABLE ENVIRONMENTAL TEMPERATURE | 10°C |
| 1407 — 6 | OPERATION SCHEDULE PERIOD | 26,280 h |
| 1408 — 7 | OPERATION START DATE AND TIME | 170101 00:00:00 |
| 1409 — 8 | TOTAL WRITING VOLUME INTO FMS | 25,600 GB |
| 1410 — 9 | SSD ID | 0 |
| 1411 — 10 | APPARATUS MODEL | A |

SSD INFORMATION TBL

CONTROL METHOD OF ENVIRONMENTAL TEMPERATURE OF STORAGE DRIVE

CROSS-REFERENCE TO RELATED APPLICATIONS

This application is a U.S. National Stage entry of PCT Application No: PCT/JP2017/015739 filed Apr. 19, 2017, the contents of which are incorporated herein by reference.

TECHNICAL FIELD

The present invention relates to a control method of the environmental temperature of a storage drive.

BACKGROUND ART

At a data center where storage devices and computers are concentratedly installed, an operator wants not only to introduce various kinds of lower-priced devices, but also to reduce the costs of building, operating the data center, and cooling those various kinds of devices in order to reduce TCO (Total Cost of Ownership). There is a technology for building a low-cooled or non-cooled data center for reducing the cost of cooling as an existing technology. In this technology, it is noticed that, even if devices are operated at a high temperature without cooling, the failure rates of the devices do not raise so much.

On the other hand, although it is common that HDDs (Hard Disk Drives) are used as storage drives in storage devices and computers introduced in a data center, recently storage drives on which flash memories (the flash memories are referred to as FMs hereinafter, and these are typically NAND-type memories) are mounted have been widely used as new storage drives in place of HDDs.

As an example of a storage drive on which FMs are mounted, there is an SSD (Solid State Drive). An SSD includes one or more FM chips and a controller that controls the FM chips, and the SSD has an advantageous effect in that it can execute I/O processing much faster than an HDD. On the other hand, the SSD has a finite number of rewritable times (this finite number of rewritable times is referred to as a lifetime hereinafter). Patent Literature 1 discloses a technology in which the program disturbance of an SSD is reduced by applying an appropriate trim profile to the SSD on the basis of the detected temperature of the SSD.

CITATION LIST

Patent Literature

Patent Literature 1: U.S. Patent Application Publication No. 2015/0092488

SUMMARY OF INVENTION

Technical Problem

There is a problem with operating SSDs in the above-mentioned low-cooled or non-cooled data center. Generally speaking, an FM has a characteristic that the lifetime of the FM becomes shorter as the temperature of the FM gets higher. In particular, SSDs, on which FMs composed of TLCs (Triple Level Cells) that have been widely used in enterprise fields and QLCs (Quad Level Cells) expected to be widely used in the near future are mounted, are comparatively inexpensive in terms of price per unit capacity, but their lifetimes are short. Therefore, there is a high possibility that the SSDs reach the ends of their lives within the operation schedule periods of the SSDs if the SSDs are used in a high-temperature environment.

On the other hand, SSDs, on which FMs composed of SLCs (Single Level Cells) and MLCs (Multi Level Cells) having comparatively long lifetimes are mounted, are comparatively expensive in terms of price per unit capacity, and therefore the introduction costs of devices including the above-mentioned SSDs become high, so that it becomes impossible to achieve the object of reducing TCO.

Solution to Problem

One of typical examples of the present invention is a method for controlling the environmental temperature of one storage drive or the environmental temperatures of plural storage drives, and this method includes specifying a first allowable environmental temperature that makes the remaining lifetime of a first storage drive longer than the remaining operation schedule period of the first storage drive; and controlling an environmental temperature adjusting device that adjusts the environmental temperature of the first storage drive on the basis of the first allowable environmental temperature.

Advantageous Effects of Invention

With the use of an aspect of the present invention, it becomes possible to realize an effective environmental temperature control for storage drives.

BRIEF DESCRIPTION OF DRAWINGS

FIG. 5 shows a software configuration example of the main memory of the apparatus management device.

FIG. 6 shows a configuration example of a cooling power cost TBL.

FIG. 7 shows a configuration example of an SSD replacement cost TBL.

FIG. 8 shows a configuration example of an apparatus information TBL.

FIG. 13 shows a configuration example of a history information TBL.

FIG. 14 shows a configuration example of an SSD information TBL.

DESCRIPTION OF EMBODIMENTS

Figure 1:
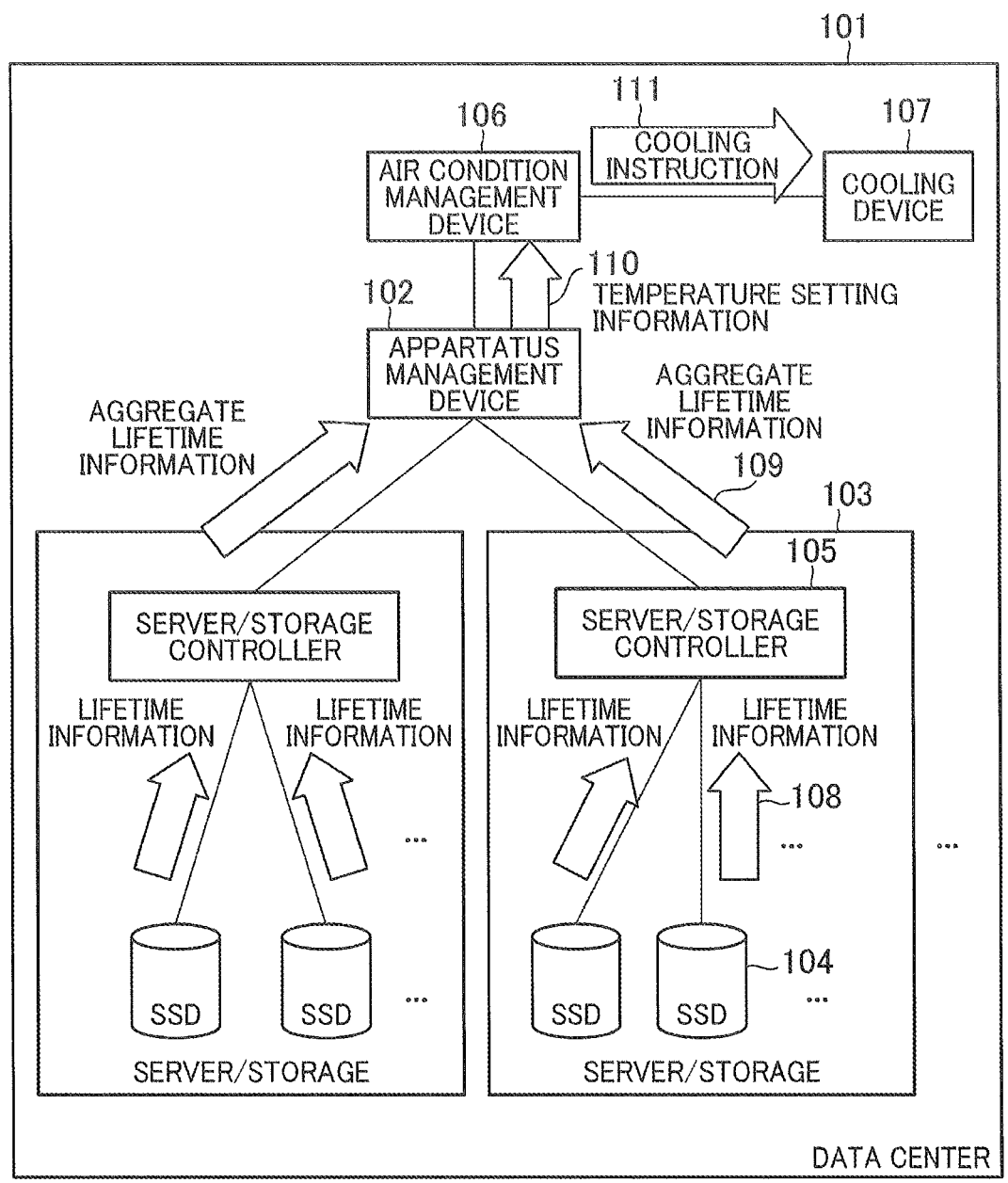
FIG. 1 shows a configuration example of a data center.

Hereinafter, an embodiment of the present invention will be explained with reference to the accompanying drawings. Here, the technical scope of the present invention is not limited by this embodiment. Although, in the following descriptions, various pieces of information will be explained in the forms of "xxx tables (tables are denoted by TBLs in this specification)", these pieces of information can be explained in the forms of data structures other than tables. In order to show that these pieces of information can be explained regardless of the data structures, an "xxx table" can be referred to as "xxx information". In addition, in the following descriptions, numbers are used as pieces of identification information of components, other kinds of identification information (for example, names or identifiers) can be used.

Programs are executed by processors included in controllers so that predefined pieces of processing are performed while storage resources and/or communication interface devices are appropriately being used. Therefore, pieces of processing executed by "programs" can be interpreted as pieces of processing executed by controllers or processors. Examples of the controllers are an apparatus management device, and SSD (Solid State Drive) controllers. Examples of the processors, storage resources, and communication interface devices are respectively CPUs (Central Processing Units), memories, and communication ports.

The controllers can include processors plus pieces of hardware that execute part of pieces of processing to be executed by the controllers or can include pieces of hardware that execute all pieces of processing to be executed by the controllers instead of the processors. The program source can be a program delivery server, or a computer-readable storage medium.

In the following descriptions, a measure of period or a measure of time is not limited. For example, a measure of period or a measure of time can be represented by one of year, month, day, minute, and second or can be represented by a combination of two or more of year, month, day, minute, and second.

In a configuration example disclosed below, the environmental temperature of a storage drive is controlled on the basis of the remaining operation schedule period of the storage drive and the remaining lifetime of the storage drive that is changed by the environmental temperature. With this, TCO (Total Cost of Ownership) can be reduced.

In the following descriptions, nonvolatile semiconductor storage media included in an SSD which is an example of a storage drive are typically NAND-type flash memories (referred to as FMs hereinafter). However, FMs of other types (for example, NOR-type FMs) can also be used instead of NAND-type FMs. Instead of FMs, nonvolatile storage media of other types, for example, phase change memories can be adopted.

In this system configuration example, regarding storage drives whose lifetimes become shorter as the environmental temperature of the storage drives gets higher, the remaining lifetimes of the storage drives are estimated for each environmental temperature, and the maximum temperature among temperatures that do not cause the ends of the lifetimes of the storage drives within the estimated operation periods of the storage drives is calculated. By increasing the setting temperature of the cooling device of the data center on the basis of this maximum temperature, the remaining lifetimes of the storage drives are taken into consideration in connection with the reduction of the cooling cost of the data center, so that TCO of the data center operation can be reduced.

FIG. 1 shows a configuration example of a data center 101. The data center 101 includes an apparatus management device 102, servers/storages 103, an air condition management device 106, and a cooling device 107. The apparatus management device 102 is connected to the servers/storages 103 and the air condition management device 106, and manages various apparatuses in the data center 101. A server/storage 103 means a server device or a storage device.

Each server/storage 103 includes SSDs 104 and a server/storage controller 105. Although FIG. 1 shows only the SSDs 104 as storage devices mounted on the servers/storages 103, HDDs (Hard Disk Drives) and storage devices of other types can be mounted along with the SSDs 104.

The air condition management device 106 manages the air condition of the data center 101. The air condition management device 106 is connected to the cooling device 107, and controls a rise in temperature owing to exhaust heats generated by the servers/storages 103. The cooling device 107 is one example of an environmental temperature adjusting device that controls environmental temperature. The cooling device 107 cools the servers/storages 103 in the data center 101.

Each SSD 104 transmits lifetime information 108 showing the remaining lifetime of each SSD 104 to the relevant server/storage controller 105. Each server/storage controller 105 transmits aggregate lifetime information 109 obtained by aggregating the lifetime information 108 received from one or more SSDs 104 to the apparatus management device 102.

The apparatus management device 102 calculates a setting temperature of the cooling device 104 that makes TCO (Total Cost of Ownership) of the data center 101 minimum on the basis of the aggregate lifetime information 109 received from one or more servers/storages 103. The apparatus management device 102 transmits temperature setting information 110 including the calculated setting temperature to the air condition management device 106.

The air condition management device 106 transmits a cooling instruction 111 including control information for the cooling device 107 on the basis of the received temperature setting information 110 to the cooling device 107. The cooling device 107 cools the servers/storages 103 of the data center 101 on the basis of the cooling instruction 111 received from the air condition management device 106.

Although it is assumed that one apparatus management device 102, one air condition management device 106, and one cooling device 107 are installed in the data center 101 in this embodiment, it is also conceivable that plural apparatus management devices 102, plural air condition management devices 106, and plural cooling devices 107 operate in conjunction with one another. It is also conceivable that a combination of some or a combination of all of the apparatus management device 102, the SSDs 104, the server/storage controllers 105, the air condition management device 106, and the cooling device 107 is implemented in one device. For example, one device can operate as both apparatus management device 102 and air condition management device 106.

Figure 2:
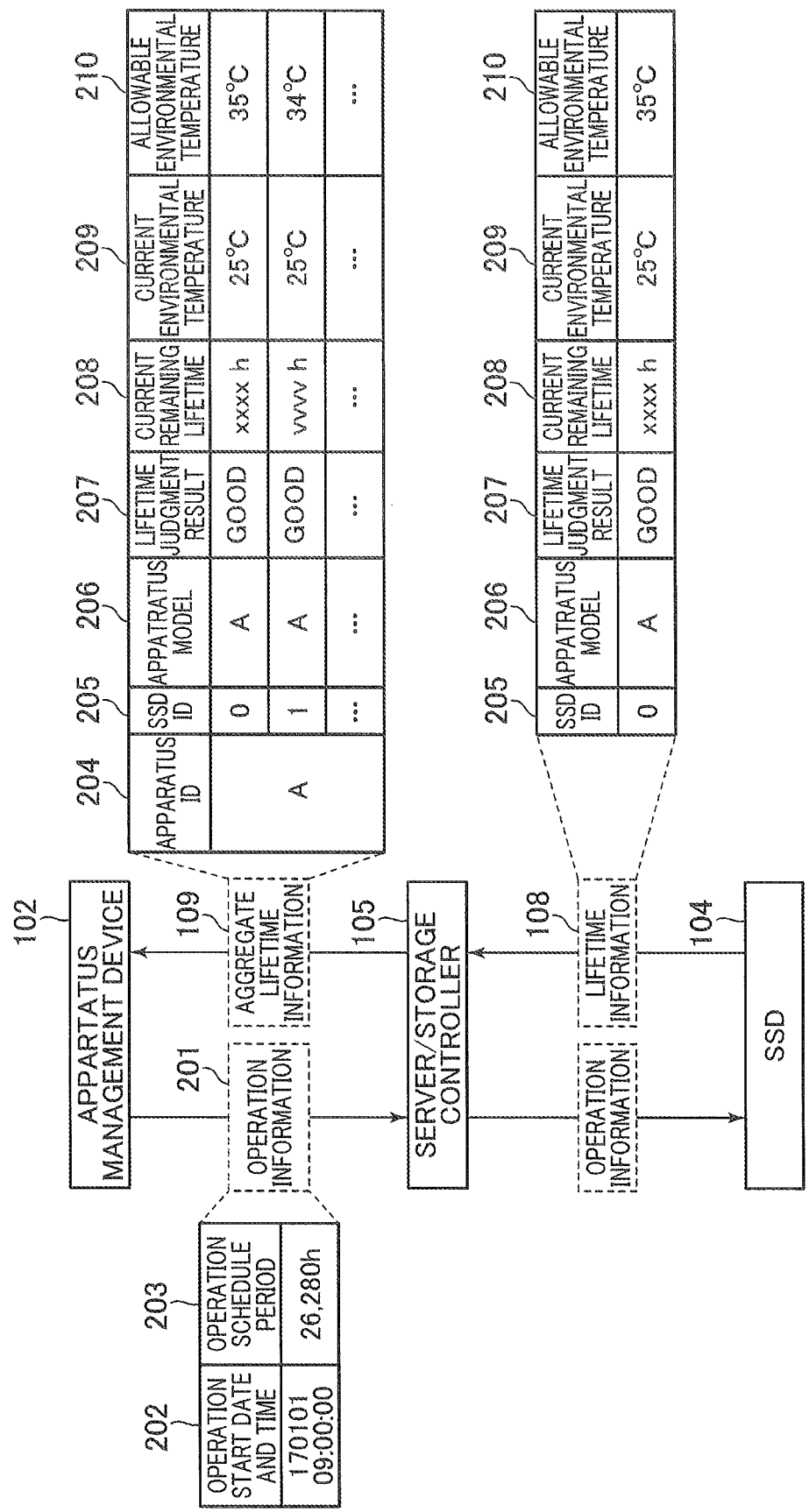
FIG. 2 shows examples of pieces of transmission/reception information among an apparatus management device, SSDs, and server/storage controllers.

FIG. 2 shows examples of pieces of transmission/reception information among the apparatus management device 102, an SSD 104, and a server/storage controller 105. When the server/storage controller 105 is connected to the apparatus management device 102, the apparatus management device 102 transmits operation information 201 to the server/storage controller 105.

The operation information 201 includes "Operation Start Date and Time" 202 and "Operation Schedule Period" 203 of the connected server/storage 103. After receiving the operation information 201, the server/storage controller 105 transmits the same information 201 to the SSD 104.

The SSD 104 regularly transmits the lifetime information 108 to the server/storage controller 105. The lifetime information 108 includes "SSD ID" 205, "Apparatus Model" 206, "Lifetime Judgment Result" 207, "Current Remaining Lifetime" 208, "Current Environmental Temperature" 209, and "Allowable Environmental Temperature" 210.

"Lifetime Judgment Result" 207 shows the state of the remaining lifetime relative to the remaining operation schedule period of the SSD 104. "Current Remaining Lifetime" 208 shows the current remaining lifetime of the SSD 104. "Current Environmental Temperature" 209 shows the current environmental temperature measured by the SSD 104. "Allowable Environmental Temperature" 210 shows an allowable environmental temperature that does not cause the end of the lifetime of the SSD 104 within the operation schedule period of the SSD 104. Even if the environmental temperature changes, in the case where it is unavoidable that the SSD 104 comes to the end of its lifetime within the operation schedule period of the SSD 104, "Allowable Environmental Temperature" 210 shows "End of Lifetime Is Unavoidable".

The server/storage controller 105 transmits the aggregate lifetime information 109 obtained by aggregating lifetime information 108 received from SSDs 104 to the apparatus management device 102. The aggregate lifetime information 109 includes "Apparatus ID" 204 that shows IDs for identifying servers/storages 103. The aggregate lifetime information 109 further includes "SSD ID" 205, "Apparatus Model" 206, "Lifetime Judgment Result" 207, "Current Remaining Lifetime" 208, "Current Environmental Temperature" 209, and "Allowable Environmental Temperature" 210 of the lifetime information 108.

Figure 3:
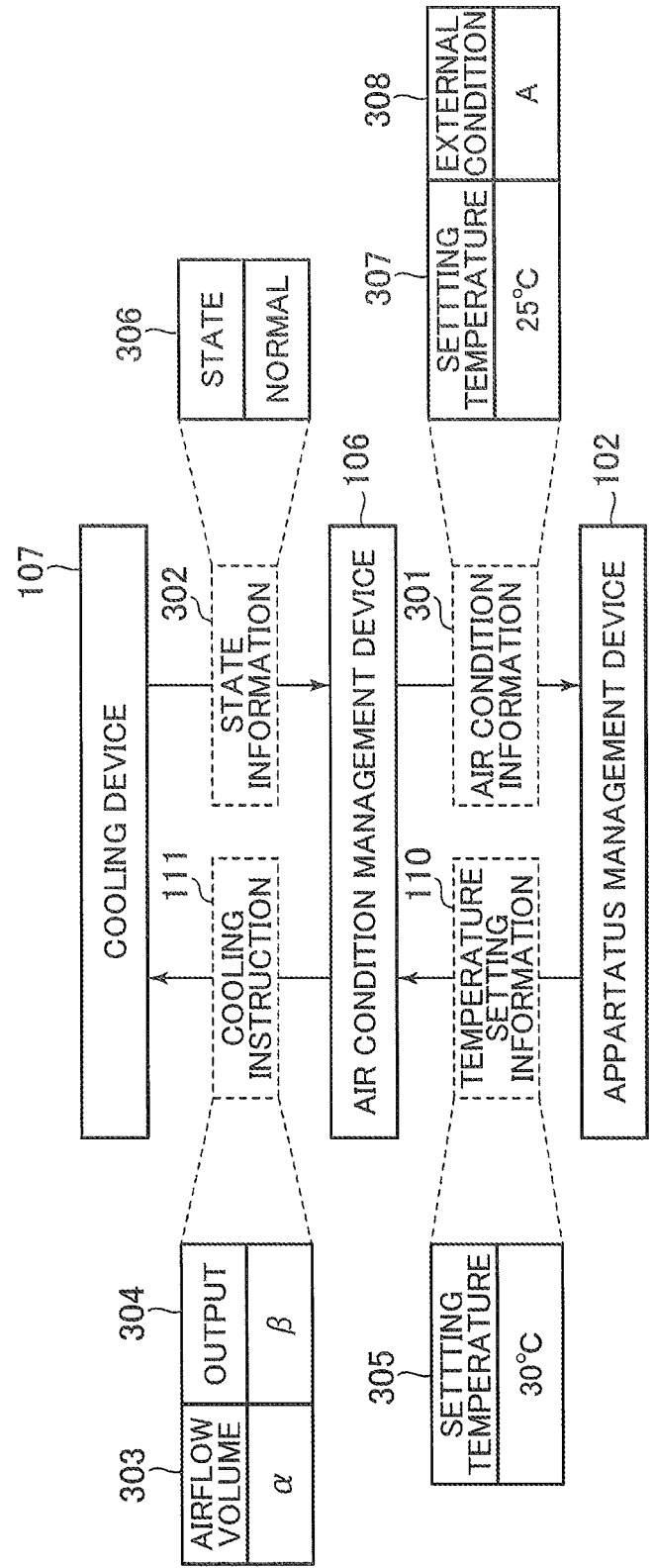
FIG. 3 shows examples of pieces of transmission/reception information among the apparatus management device, an air condition management device, and a cooling device.

FIG. 3 shows examples of pieces of transmission/reception information among the apparatus management device 102, the air condition management device 106, and the cooling device 107. The apparatus management device 102 requests air condition information 301 from the air condition management device 106 and receives this information when the apparatus management device 102 calculates a stetting temperature that makes TCO of the data center 101 minimum. The air condition information 301 includes "Setting Temperature" 307 that shows the current setting temperature and "External Condition" 308 showing external conditions such as an external temperature, an electric power charge for each time zone, and so on except for the setting temperature.

After calculating a setting temperature that makes TCO minimum, the apparatus management device 102 transmits temperature setting information 110 to the air condition management device 106. The temperature setting information 110 includes "Setting Temperature" 0305 showing the setting temperature calculated by the apparatus management device 102.

The air condition management device 106 transmits the cooling instruction 111 to the cooling device 107 on the basis of the temperature setting information 110 received from the apparatus management device 102. The cooling instruction 111 includes "Airflow Volume" 303 showing airflow volume and "Output" 304 showing cooling power.

The cooling device 107 executes cooling on the basis of the cooling instruction 111 received from the air condition management device 106. The cooling device 107 transmits state information 302 to the air condition management device 106, and the air condition management device 106 monitors the state of the cooling device 107 on the basis the received state information 302. The state information 0302 includes "State 306" that shows whether the cooling device 107 is normal or abnormal, and when the cooling device 107 is abnormal, shows the state of the abnormal cooling device 107.

Figure 4:
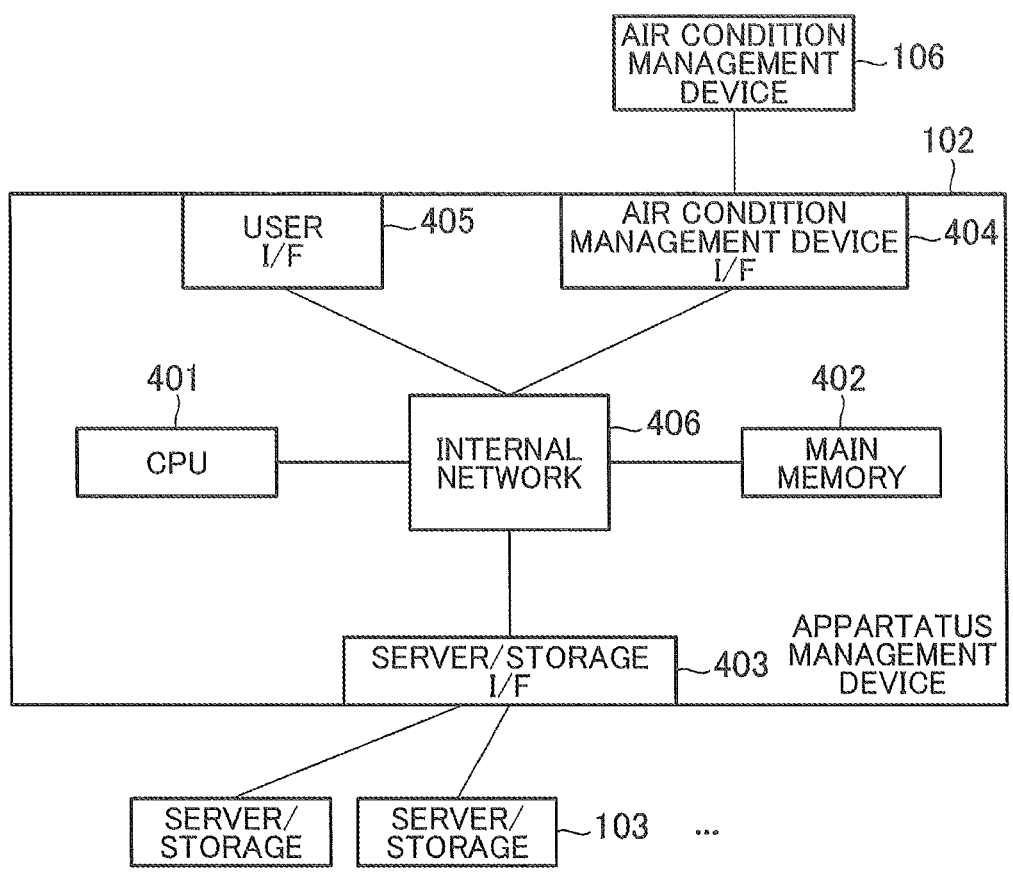
FIG. 4 shows a configuration example of the apparatus management device.

FIG. 4 shows a configuration example of the apparatus management device 102. The apparatus management device 102 includes a CPU 401, a main memory 402, a server/storage I/F 403, an air condition management device I/F 404, and a user I/F 405, and these are connected with one another via an internal network 406.

The CPU 401 is a processor that controls the entirety of the apparatus management device 102, and the CPU 401 operates on the basis of microprograms stored in the main memory 402. The server/storage I/F 403 is controlled by the CPU 401, and transmits and receives various kinds of information to and from the server/storage 103.

The air condition management device I/F 404 is controlled by the CPU 401, and transmits and receives various kinds of information to and from the air condition management device 106. The user I/F 405 is controlled by the CPU 401, and outputs the state information of various apparatuses to an operator of the data center 101, and receives various kinds of control information from the operator. The user I/F 405 includes a display device, a mouse, and a keyboard, for example. The internal network 406 can include switches, and alternatively the internal network 406 can be replaced with ASICs (Application Specific Integrated Circuits).

FIG. 5 shows a software configuration example of the main memory 402. The main memory 402 includes a program area 501 and a TBL area 502. The program area 501 and the TBL area 502 are areas in which programs and various tables that control the apparatus management device 102 are stored respectively.

The program area 501 stores a TCO reduction program 503, a server/storage communication program 504, an air condition management terminal communication program 505, and a user communication program 506.

The TCO reduction program 503 calculates a setting temperature of the cooling device 107 that makes TCO of the data center 101 minimum. The server/storage communication program 504 controls the server/storage I/F 403, and transmits and receives various kinds of information to and from the server/storage 103. The air condition management terminal communication program 505 controls the air condition management device 106, and transmits and receives various kinds of information to and from the air condition management device 106. The user communication program 506 controls the user I/F 405, and transmits and receives various kinds of information to and from an operator of the data center 101.

The TBL area 502 stores a cooling power cost TBL 507, an SSD replacement cost TBL 508, and an apparatus information TBL 509. The cooling power cost TBL 507 is referred to by the TCO reduction program 503, and the cooling power cost TBL 507 shows information necessary for calculating cooling power costs. The SSD replacement cost TBL 508 is referred to by the TCO reduction program 503, and the SSD replacement cost TBL 508 shows information necessary for calculating costs required for the replacement of SSDs 104. The apparatus information TBL 509 includes information regarding severs/storages 103.

FIG. 6 shows a configuration example of the cooling power cost TBL 507. The cooling power cost TBL 507 includes "External Condition" 601, "Setting Temperature" 602, and "Cooling Power for Apparatus Total Power Consumption" 603. "External Condition" 601 shows conditions that have influence on the power consumption of the cooling device 107 except for the setting temperature such as an external temperature, an electric power charge for each time zone, and so on. "Setting Temperature" 602 shows the setting temperature of the cooling device 107.

"Cooling Power for Apparatus Power Consumption" 603 shows electric power necessary for cooling an apparatus corresponding to both "External Condition" 601 and "Setting Temperature" 602. In this embodiment, "Cooling Power for Device Power Consumption" 603 shows a cost necessary for cooling the power consumption 1 Wh of a server/storage 103. "Cooling Power" 603 can also show other kinds of information if the cooling power cost can be calculated using these kinds of information.

FIG. 7 shows a configuration example of the SSD replacement cost TBL 508. The SSD replacement cost TBL 508 includes "Apparatus Model" 701 and "Replacement Cost" 702. "Apparatus Model" 701 shows information for identifying apparatus models of SSDs 104 mounted on servers/storages 103. "Replacement Cost" 702 shows costs necessary for replacing SSDs 104 corresponding to the respective items listed in "Apparatus Model" 701.

FIG. 8 shows a configuration example of the apparatus information TBL 509. The apparatus information TBL 509 includes "Apparatus ID" 801, "Apparatus Model" 802, "Operation Start Date and Time" 803, and "Operation Schedule Period" 804. "Apparatus ID" 801 shows information for identifying servers/storages 103 connected to the apparatus management device 102.

"Apparatus Model" 802 shows information for identifying the apparatus models of servers/storages 103 connected to the apparatus management device 102. "Operation Start Date and Time" 803 shows dates and times at which servers/storages 103 connected to the apparatus management device 102 start to operate. "Operation Schedule Period" 804 shows schedule periods from time when servers/storages 103, which are connected to the apparatus management device 102, start operating to times when the servers/storages 103 finish their operations respectively.

Figure 9:
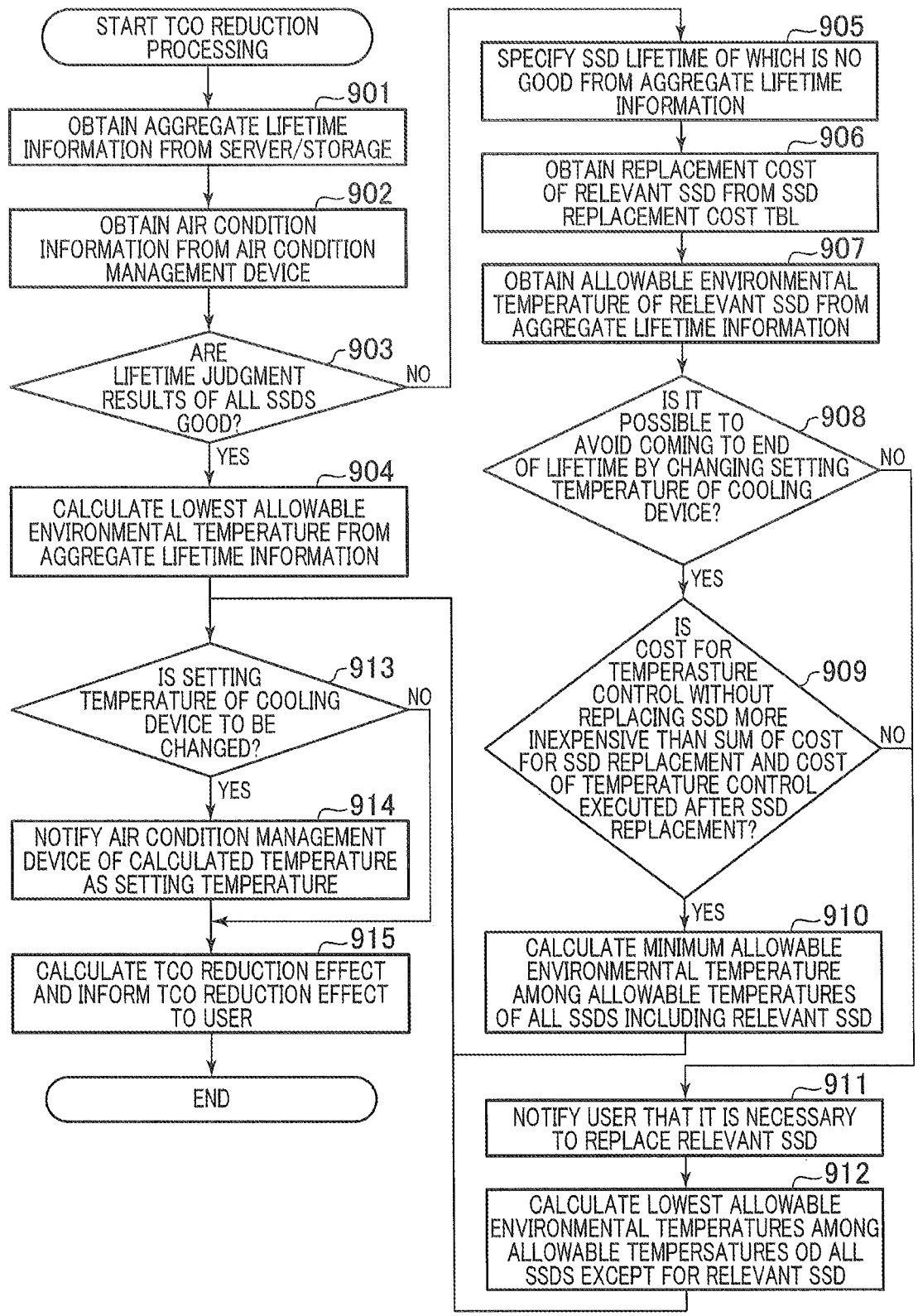
FIG. 9 is a sequence diagram showing an example of a processing flow for reducing TCO on the basis of the remaining lifetimes of SSDs in the apparatus management device.

FIG. 9 is a sequence diagram showing an example of a processing flow in which the apparatus management device 102 reduces TCO on the basis of the remaining lifetimes of SSDs 104. The TCO reduction program 503 regularly starts the relevant TCO reduction processing. First, the TCO reduction program 503 requests aggregate lifetime information 109 from the servers/storages 103 via the server/storage communication program 504, and obtains this information (at Step 901). The TCO reduction program 503 requests air condition information 301 from the air condition management device 106 via the air condition management terminal communication program 505, and obtains this information (at Step 902).

The TCO reduction program 503 judges whether the lifetime judgment results of all SSDs 104 are "Good" or not with reference to "Lifetime Judgment Result" 207 of the aggregate lifetime information 109 obtained at Step 901 (at Step 903). "Lifetime Judgment Result" 207 shows "Good" if the remaining lifetime of an SSD 104 at the current environmental temperature is longer than the relevant remaining operation schedule period. "Lifetime Judgment Result" 207 shows "No-Good" if the remaining lifetime of an SSD 104 at the current environmental temperature is longer than the relevant remaining operation schedule period.

If the lifetime judgment results of all the SSDs 104 are "Good" (Yes at Step 903), the TCO reduction program 503 proceeds to Step 904 (A). This is a case where it can be expected that none of all the SSDs 104 comes to the end of its lifetime within its operation schedule period at its current environmental temperature.

On the other hand, if the lifetime judgment result of any of the SSDs 104 is "No-Good" (No at Step 903), the TCO reduction program 503 proceeds to Step 905 (B). This is a case where it can be expected that any of all the SSDs 104 comes to the end of its lifetime within its operation schedule period at its current environmental temperature. It will be assumed that only one SDD is "No-Good" in the following descriptions.

The TCO reduction program 503 determines the lowest allowable environmental temperature of allowable temperatures corresponding to all the SSDs 104 with reference to "Allowable Environmental Temperature" 210 of the aggregate lifetime information 109 obtained at Step 901 (at Step 904).

"Allowable Environmental Temperature" 210 shows a temperature that satisfies a condition that each SSD 104 has the remaining lifetime of its own equal to or longer than the remaining operation schedule period of its own. For example, "Allowable Environmental Temperature" 210 shows the (calculated) highest environmental temperature of temperatures that satisfy the condition that the remaining lifetime is equal to or longer than the remaining operation schedule period. With this, power cost can be reduced effectively. As an example, the highest environmental temperature is a temperature that makes the remaining lifetime is equal to the remaining operation schedule period.

Because "Lifetime Judgment Result" 207 shows "Good" for all the SSDs 104, the value shown by "Allowable Environmental Temperature" 210 of each SSD 104 is equal to or larger than the value shown by "Current Environmental Temperature" 209 of each SSD 104. This means that the setting temperature of the cooling device 104 can be kept as it is or can be raised.

Because the environmental temperature of an SSD 104 can be changed depending on the position of the SSD 104 in the data center or the server/storage 103, the TCO reduction program 503 can determine the allowable environmental temperature of the SSD 104 on the basis of the value shown by "Current Environmental Temperature" 209 in addition to the value shown by "Allowable Environmental Temperature" 210. The TCO reduction program 503 can determine the value shown by "Allowable Environmental Temperature" 210 as the allowable environmental temperature of the SSD 104. Afterward, the TCO reduction program 503 proceeds to Step 913 (F).

(B)

The TCO reduction program 503 identifies an SSD 104 the lifetime judgment of which is "No-Good" with reference to "Lifetime Judgment Result" 207 of the aggregate lifetime information 109 obtained at Step 901 (at Step 905). The TCO reduction program 503 determines a replacement cost on the basis of a value shown by "Apparatus Model" 206 of the SSD 104 identified at Step 905 with reference to the SSD Replacement Cost TBL 508 (at Step 906).

The TCO reduction program 503 obtains information about "Allowable Environmental Temperature" 210 for the SSD 104 identified at Step 905 with reference to the aggregate lifetime information 109 obtained at Step 901 (at Step 907).

The TCO reduction program 503 judges whether it is possible for the SSD 104 to avoid coming to the end of its lifetime or not by changing the setting temperature of the cooling device 107 on the basis of the information about "Allowable Environmental Temperature" 210 obtained at Step 907 (at Step 908).

In the case where "Allowable Environmental Temperature" 210 shows the values of allowable environmental temperatures about all the SSDs 104, the TCO reduction program 503 judges that all the SSDs 104 can avoid coming to the ends of their lifetimes by changing the setting temperature of the cooling device 107. In the case where "Allowable Environmental Temperature" 210 shows that any SSD 104 "cannot avoid coming to the end of its lifetime", the TCO reduction program 503 judges that it is impossible to avoid coming to the end of the lifetime within the operation schedule period by changing the setting temperature of the cooling device 107.

If it is judged that it is possible to avoid coming to the end of the lifetime within the operation schedule period by changing the setting temperature of the cooling device 107 (Yes at Step 908), the TCO reduction program 503 proceeds to Step 909 (C). On the other hand, in the case where it is judged that it is impossible to avoid coming to the end of the lifetime within the operation schedule period even if the setting temperature of the cooling device 107 is changed (No at Step 908), the TCO reduction program 503 proceeds to Step 911 (E).

(C)

The TCO reduction program 503 compares an operation cost in the case of the SSD 104 not being replaced and an operation cost in the case of the SSD 104 being replaced, and judges which of the two operation costs is inexpensive (at Step 909).

To put it concretely, first the TCO reduction program 503 calculates a cost in the case where the operation is continued by changing the setting temperature of the cooling device 107 without replacing the SSD 104. The setting temperature of the cooling device 107 after the setting temperature is changed is the minimum allowable environmental temperature determined at Step 904. For example, the TCO reduction program 503 calculates estimated power costs regarding the remaining operation schedule periods at the changed setting temperature using the cooling power cost TBL 507.

Furthermore, the TCO reduction program 503 calculates the sum of the replacement of the SSD 104 and the power cost of the cooling device 107 after the SSD are replaced. The replacement cost of the SSD 104 has already obtained at Step 906. The TCO reduction program 503 determines the lowest allowable environmental temperature of allowable temperatures regarding SSDs 104 except for the SSD 104 that is to be replaced with reference to "Allowable Environmental Temperature" 210 of the aggregate lifetime information 109 obtained at Step 901. How to determine an allowable environmental temperature is similar to that executed at Step 904.

The TCO reduction program 503 calculates estimated power costs regarding the remaining operation schedule periods at the determined allowable environmental temperature using the cooling power cost TBL 507. It is also conceivable that the TCO reduction program 503 calculates estimated power costs regarding the remaining operation schedule periods at the current setting temperature.

If the judgment result at Step 909 shows that it is more inexpensive to continue the operation by changing the setting temperature of the cooling device 107 (Yes at Step 909), the TCO reduction program 503 proceeds to Step 910 (D). On the other hand, the judgment result at Step 909 shows that it is more inexpensive to continue the operation by replacing the SSD 104 (No at Step 909), the TCO reduction program 503 proceeds to Step 911 (E).

The TCO reduction program 503 calculates the minimum allowable environmental temperature among the allowable temperatures of all the SSDs 104 including the SSD 104 whose remaining lifetime is "No-Good" with reference to "Allowable Environmental Temperature" 210 of the aggregate lifetime information 109 obtained at Step 901 (at Step 910). The determination method of the allowable environmental temperature of each SSD 104 is similar to that executed at Step 904. Afterward, the TCO reduction program 503 proceeds to Step 913 (F).

The TCO reduction program 503 proposes that it is necessary to replace the SSD 104 whose remaining lifetime is "No-Good" to a user via the user communication program 506 and user I/F 405 (at Step 911).

The TCO reduction program 503 calculates the lowest allowable environmental temperature among the temperatures of all the SSDs 104 except for the SSD 104 to be replaced with reference to "Allowable Environmental Temperature" 210 of the aggregate lifetime information 109 obtained at Step 901 (at Step 912). The determination method of the allowable environmental temperature of each SSD 104 is similar to that executed at Step 904. Afterward, the TCO reduction program 503 proceeds to Step 913 (F).

The TCO reduction program 503 compares the value shown by "Setting Temperature" 307 of the air condition information 301 obtained at Step 902 with the allowable temperature determined at Step 904, at Step 910, or at Step 912, and judges whether the setting temperature of the cooling device 107 to be changed or not (at Step 913). In the case of the setting temperature device 107 being changed (Yes at Step 913), the TCO reduction program 503 proceeds to Step 914 (G). On the other hand, in the case of the setting temperature device 107 not being changed (No at Step 913), the TCO reduction program 503 proceeds to Step 915 (H).

The TCO reduction program 503 notifies the air condition management device 106 of the allowable environmental temperature determined at Step 904, at Step 911, or at Step 913 as a value shown by "Setting Temperature" 305 via the air condition management terminal communication program 505 (at Step 914). The initial temperature (temperature at the time of the operation start) of the cooling device 107 is, for example, a reference temperature. It is conceivable that an upper limit can be set to the value shown by "Setting Temperature" 305. For example, the TCO reduction program 503 can determine a value shown by "Setting Temperature" 305 so that the difference between the value set to "Setting Temperature" 305 and the current setting temperature is smaller than a threshold.

The TCO reduction program 503 calculates the TCO reduction effect of the data center brought about by Step 901 to Step 914, and proposes the TCO reduction effect to the user via the user communication program 506 and the user I/F 405 (at Step 915). Afterward, the TCO reduction program 503 finishes its processing.

(H)

In a calculation example of the TCO reduction effect, a difference between the operation cost determined by the TCO reduction processing shown in FIG. 9 and a predefined operation cost at the reference temperature is calculated. The operation cost at the reference temperature is a power cost at the reference temperature or the sum of the power cost at the reference temperature and the cost of the necessary SSD replacement. SSDs whose values shown by "Allowable Environmental Temperature" 210 are lower than the reference temperature are SSDs that are necessary to be replaced. It is conceivable that the TCO reduction effect proposed to the user is a TCO reduction effect that is brought about by the TCO reduction processing, or the total sum of TCO reduction effects that have been brought about by the TCO reduction processing so far.

As described above, TCO can be reduced effectively by controlling the environmental temperature on the basis of the remaining operation schedule periods of SSDs and the remaining lifetimes of the SSDs that are changed depending on the environmental temperature. It is possible to select more inexpensive option by comparing an operation cost in the case of any SSD 104 not being replaced and an operation cost in the case of any SSD 104 being replaced with each other, so that TCO can be reduced effectively.

The SSD 104 that comes to the end of its lifetime (the SSD whose value shown by "Lifetime Judgment Result" 207 is "No-Good") at the current environmental temperature (current setting temperature) is selected and it is judged whether the SSD 104 has to be replaced or not, so that the setting temperature of the cooling device 107 can be kept high, and the power cost can be reduced effectively. In some designs, "Lifetime Judgment Result" 207 can show judgment results at temperatures different from the current environmental temperature (for example, at the reference temperature).

In the above-mentioned example, it has been assumed that only one SSD is "No-Good" so far. If the lifetime judgment results of plural SSDs 104 are "No-Good", the TCO reduction program 503 executes Step 905 to Step 908 regarding all the "No-Good" SSDs, for example. The TCO reduction program 503 executes Step 911 on all the SSDs 104 that cannot avoid coming to the ends of their lifetimes within their operation schedule periods respectively (No at Step 908).

The TCO reduction program 503 calculates an operation cost corresponding to an option of SSD replacement regarding SSDs 104 that can avoid coming to the ends of their lifetimes within their operation schedule periods respectively (Yes at Step 908). The option of SSD replacement includes, for example, an option in which no SSD is replaced, and further includes options in which SSD groups having different number of SSDs selected in the order of their allowable environmental temperatures from lowest respectively are replaced. The TCO reduction program 503 selects an option that charges the lowest estimated operation cost.

The TCO reduction program 503 compares the allowable environmental temperature of a selected option with the setting temperature of the cooling device 107 (at Step 913). In the case where no one of all the "No-Good" SSDs 104 can avoid coming to the end of its lifetime within its operation schedule period, the TCO reduction program 503 compares the lowest allowable environmental temperature of the allowable environmental temperatures of all "Good" SSDs 104 with the setting temperature of the cooling device 107 (at Step 913).

In the above-mentioned example, the environmental temperatures of plural SSDs 104 are adjusted at the same time. With this, effective environmental temperature control can be executed. The environmental temperature control according to this embodiment can be applied to a single SSD. In some designs, it is conceivable that an environmental temperature is controlled without any regard for replacing an SSD.

Figure 10:
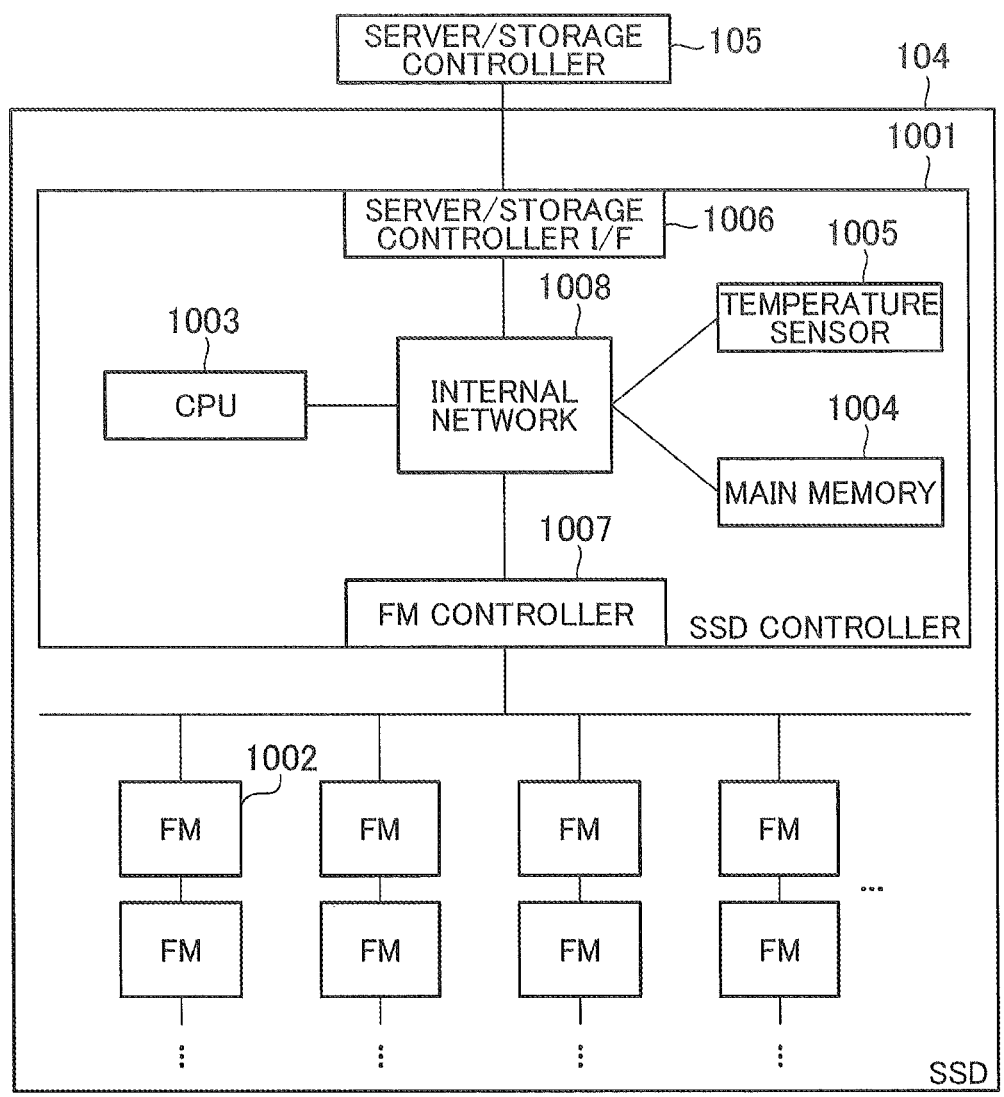
FIG. 10 shows a configuration example of an SSD.

FIG. 10 shows a configuration example of an SSD 104. The SSD 104 includes an SSD controller 1001 and one or more FM chips 1002. The SSD controller 1001 controls the behavior of the SSD 104. The SSD controller 1001 includes a CPU 1003, a main memory 1004, a temperature sensor 1005, a server/storage controller I/F 1006, and an FM controller 1007. These components are connected to one another via an internal network 1008.

The CPU 1003 is a processor that controls the entirety of the SSD controller 1001, and operates on the basis of a microprogram stored in the main memory 1004. The temperature sensor 1005 is controlled by the CPU 1003, and measures the environmental temperature of the SSD 104. The server/storage controller I/F 1006 is controlled by the CPU 1003, and transmits and receives various kinds of information to and from the server/storage controller 105.

The FM controller 1007 is controlled by the CPU 1003, and executes read/write/erase on the one or more FM chips 1002. The internal network 1008 can include switches, and alternatively the internal network 1008 can be replaced with ASICs (Application Specific Integrated Circuits) having a switching function. In this embodiment, the SSD 104 is a memory device including one or more FMs, and the external shape of the SSD 104 is not limited to a form factor.

Figures 11, 12:
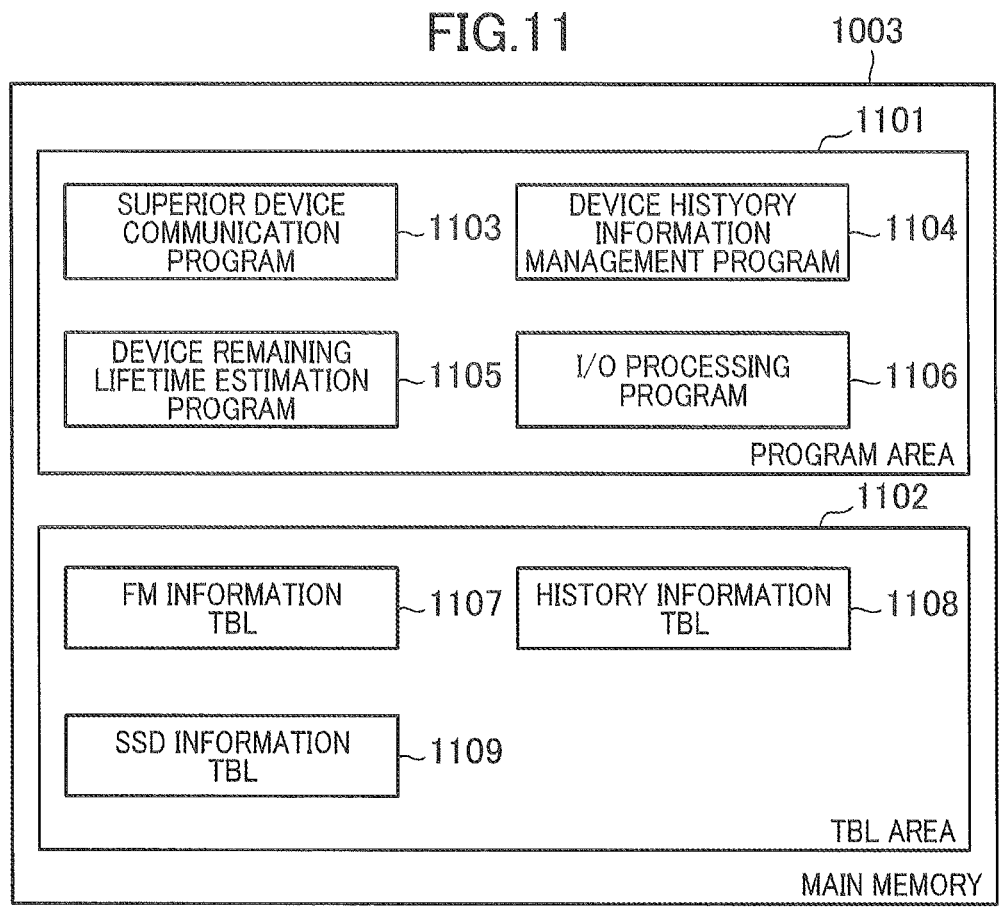
FIG. 11 shows a software configuration example in the main memory of an SSD.
FIG. 12 shows a configuration example of an FM information TBL.

FIG. 11 shows a software configuration example of the main memory 1004. The main memory 1004 includes a program area 1101 and a TBL area 1102. The program area 1101 and the TBL area 1102 are areas for storing programs for controlling the SSD 104 and various kinds of tables. The program area 1101 stores a superior device communication program 1103, a device history information management program 1104, a device remaining lifetime estimation program 1105, and an I/O processing program 1106.

The superior device communication program 1103 transmits and receives various kinds of information to and from the server/storage controller 105 that is a superior device of the SSD 104. The device history information management program 1104 manages information that is changed in accordance with an operation such as the environmental temperature and the remaining lifetime of the SSD 104, and the like as history information.

The device remaining lifetime estimation program 1105 estimates the remaining lifetime of the SSD 1104 on the basis of the environmental temperature and the state of the one or more FM chips 1002. The I/O processing program 1106 interprets I/O requests from the server/storage controller 105 and executes read/write/erase on the one or more FM chips 1002.

The TBL area 1102 includes an FM information TBL 1107, a history information TBL 1108, and an SSD information TBL 1109. The FM information TBL 1107 is referred to or updated when the device remaining lifetime estimation program 1105 is executed, and includes information that is necessary for estimating the lifetimes of the one or more FM chips 1002.

The history information TBL 1108 is referred to or updated when the device history information management program 1104 is executed, and includes information that is changed in accordance with an operation such as the environmental temperature and the remaining lifetime of the SSD 104, and the like. The SSD information TBL 1109 includes information regarding the SSD 104.

FIG. 12 shows a configuration example of the FM information TBL 1107. The FM information TBL 1107 includes "Management™" 1201, "State" 1202, and "Lifetime Information" 1203. "Management™" 1201 shows identifiers given to the management units of the lifetimes of the one or more FM chips 1002. The management units are, for example, one or plural FM chips 1002, or dice, planes, or blocks in the one or plural FM chips 1002.

"State" 1202 includes normal states or faulty states regarding respective objects for lifetime management shown by "Management if" 1201. "Lifetime Information" 1203 includes information necessary for estimating the remaining lifetimes regarding the respective objects for lifetime management shown by "Management #" 1201. "Lifetime Information" 1203 shows, for example, the numbers of times of erasing and coefficients for calculating remaining lifetimes from the numbers of times of erasing. "Lifetime Information" 1203 is updated as needed by the device history information management program 1104.

FIG. 13 shows a configuration example of the history information TBL 1108. The history information TBL 1108 includes "Generation #" 1301, "Update Date and Time" 1302, "Current Environmental Temperature" 1303, "Total Writing Volume into FMs" 1304, and "Device Remaining Lifetime for Each Environmental Temperature" 1305. The history information TBL 1108 is updated as needed by the device history information management program 1104.

"Generation™" 1301 shows identifiers given to identify the history information for respective generations, and shows the identifiers for the device history information management program 1104 to identify the generations of respective pieces of history information. "Update Date and Time" 1302 shows the obtention dates and times of pieces of history information regarding the respective generations. "Current Environmental Temperature" 1303 shows environmental temperatures obtained from temperature sensors 1005 for the respective generations.

"Total Writing Volume into FMs" 1304 shows total data volume written into all the FM chips 1002 during a time interval from the operation start of the SSD 104 to the obtention of history information for each generation. "Device Remaining Lifetime for Each Environmental Temperature" 1305 shows the estimated remaining lifetime of the SSD 104 at each environmental temperature.

FIG. 14 shows a configuration example of the SSD information TBL 1109. The SSD information TBL 1109 includes: "Device Capacity" 1401; "Mounted Flash Memory Capacity" 1402; "Reference Lifetime Of Flash Memory" 1403; "Reference Environmental Temperature" 1404; "Highest Allowable Environmental Temperature" 1405; "Lowest Allowable Environmental Temperature" 1406; "Operation Schedule Period" 1407; "Operation Start Date and Time" 1408; "Total Writing Volume Into FMs" 1409; "SSD ID" 1410; and "Apparatus Model" 1411.

"Device Capacity" 1401 shows data capacity that the SSD 104 can store and that is proposed to the relevant server/storage controller 105 by the SSD 104. "Mounted Flash Memory Capacity" 1402 shows the total capacity of FM chips 1002 mounted on the SSD 104. "Reference Lifetime of Flash Memory" 1403 shows a lifetime of an FM chip 1002 used in an operation in a reference condition. "Reference Lifetime of Flash Memory" 1403 can be represented, for example, by the TBW (Total Bytes Written) of the SSD, or by the DWPD (Drive Write Per Day) of the SSD within the guarantee operation period of the SSD.

"Reference Environment Temperature" 1404 shows an environmental temperature that is used as a reference for defining "Reference Lifetime of Flash Memory" 1403. "Highest Allowable Environmental Temperature" 1405 shows the highest temperature of temperatures at which the SSD 104 can normally operate. "Lowest Allowable Environmental Temperature" 1406 shows the lowest temperature of temperatures at which the SSD 104 can normally operate. "Operation Schedule Period" 1407 shows a schedule period from the start to the finish of the operation of the SSD 104.

"Operation Start Date and Time" 1408 shows the date and time when the SSD 104 starts its operation. "Total Writing Volume into FMs" 1409 shows the total volume of data written into all FM chips 1002 mounted on the SSD 104. "Total Writing Volume into FMs" 1409 is updated as needed by the device history information management program 1104. "SSD ID" 1410 shows an identifier for identifying the SSD 104. "Apparatus Model" 1411 shows an identifier for identifying the apparatus model of the SSD 104.

Figure 15:
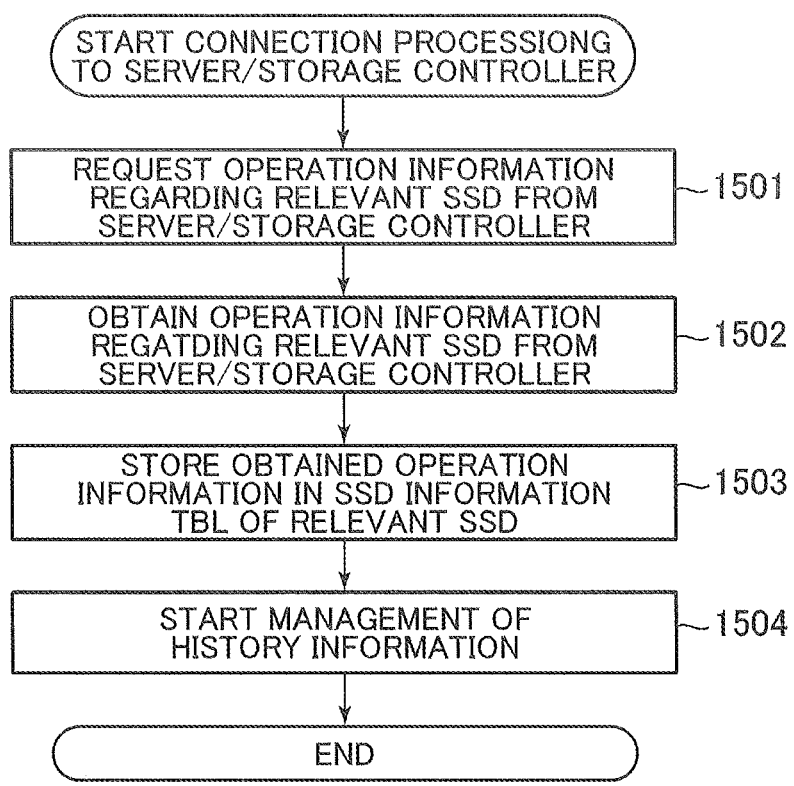
FIG. 15 is a sequence diagram showing an example of a processing flow at a time when an SSD 104 is connected to a server/storage controller 105.

FIG. 15 is a sequence diagram showing an example of a processing flow at a time when the SSD 104 is connected to the relevant server/storage controller 105. The superior device communication program 1103 requests operation information 201 regarding the SSD 104 from the server/storage controller 105 when connected to the server/storage controller 105 (at Step 1501).

The superior device communication program 1103 obtains the operation information 201 regarding SSD 104 from the server/storage controller 105 (at Step 1502). The superior device communication program 1103 stores the operation information 201 obtained at Step 1502 in the SSD information TBL 1109 (at Step 1503).

The superior device communication program 1103 calls out the device history information management program 1104, and after updating the history information TBL 1108, the superior device communication program 1103 finishes its processing (Step 1504). Here, the update processing of the history information TBL 1108 will be described later in detail.

Figure 16:
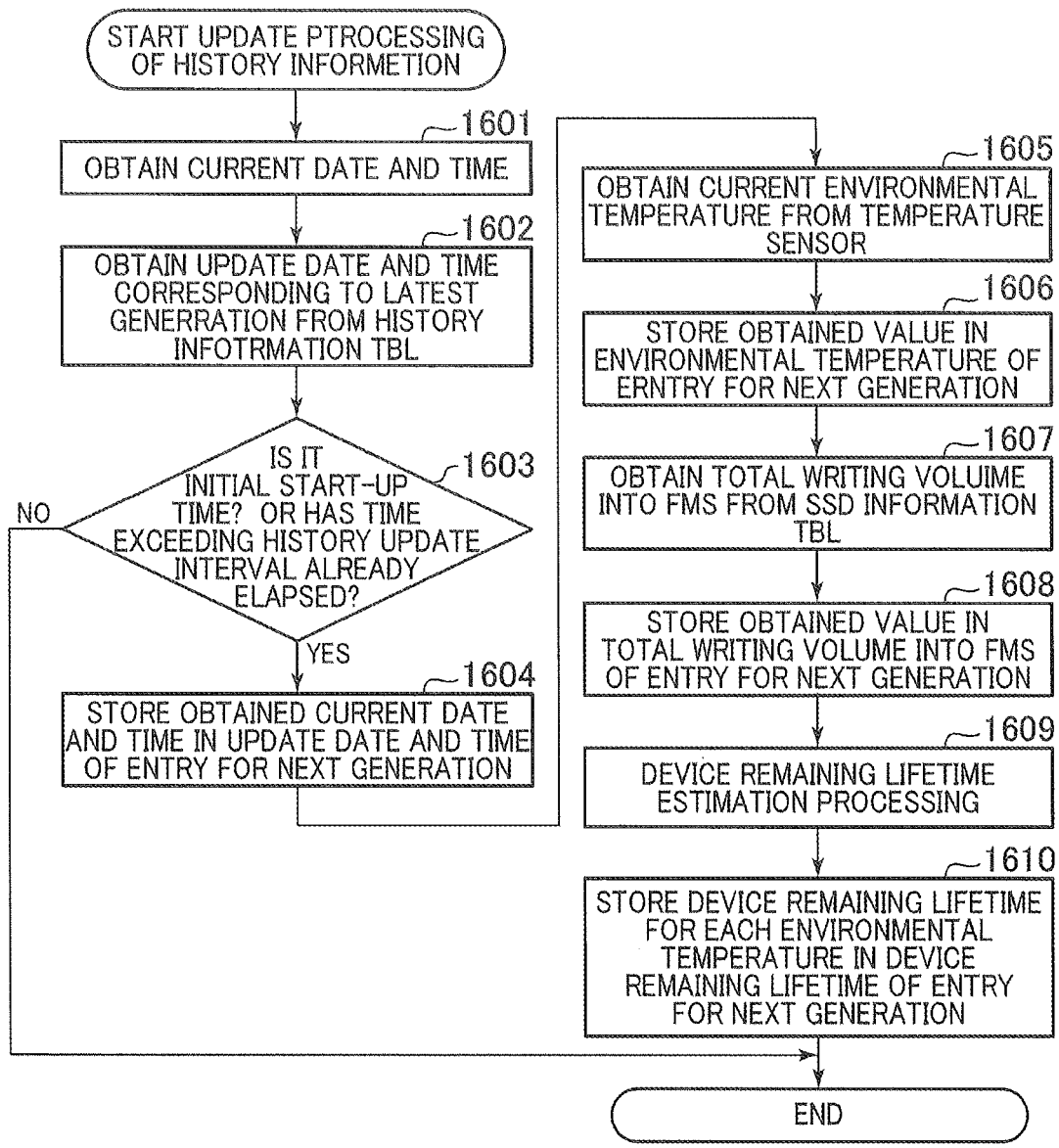
FIG. 16 is a sequence diagram showing an example of a processing flow for updating a history information TBL in an SSD.

FIG. 16 is a sequence diagram showing an example of a processing flow for updating a history information TBL 1108 in the SSD 104. The device history information management program 1104 obtains the current date and time (at Step 1601). Here, the current date and time can be obtained from a clock embedded in the SSD 104 or from a server/storage controller 105. The device history information management program 1104 obtains an update date and time corresponding to the latest generation from the history information TBL 1108 (at Step 1602).

The device history information management program 1104 judges whether the current time is an initial start-up time or not or whether or not a difference between the current date and time obtained at Step 1601 and the update date and time corresponding to the latest generation obtained at Step 1602 exceeds a history update interval (at Step 1603).

If the current date and time is the initial start-up time or if a time that exceeds the history update interval has elapsed from the update corresponding to the latest generation (the previous update) (Yes at Step 1603), the device history information management program 1104 proceeds to Step 1604. On the other hand, if the current date and time is not the initial start-up time and a time that exceeds the history update interval has not elapsed from the update corresponding to the latest generation (the previous update) (No at Step 1603), the device history information management program 1104 finishes its processing. The history update interval can be an interval of a constant length or an interval of a variable length.

The device history information management program 1104 stores the current date and time obtained at Step 1601 in "UPDATE Date and Time" 1302 of an entry for the next generation, in the history information TBL 1108, so that the generation of update information is updated (at Step 1604). The device history information management program 1104 obtains the current environment temperature from a temperature sensor 1005 (at Step 1605). The device history information management program 1104 stores the current environmental temperature obtained at Step 1605 in "Current Environmental Temperature" 1303 of an entry for the next generation, in the history information TBL 1108 (at Step 1606).

The device history information management program 1104 obtains a value shown by "Total Writing Volume into FMs" 1409 from the SSD information TBL 1109 (at Step 1607). The device history information management program 1104 stores the value shown by "Total Writing Volume into FMs" 1409 obtained at Step 1607 in "Total Writing Volume into FMs" 1304 of an entry for the next generation, in the history information TBL 1108 (at Step 1608).

The device history information management program 1104 calls out the device remaining lifetime estimation program 1105, and estimates the remaining lifetime of the SSD 104 (at Step 1609). The remaining lifetime estimation processing of the SSD 104 will be described in detail later. The device history information management program 1104 stores a remaining lifetime for each environmental temperature of the SSD 104 obtained at Step 1609 in "Device Remaining Lifetime for Each Environmental Temperature" 1305 of an entry for the next generation in the history information TBL 1108, and finishes its processing (at Step 1610).

Figure 17:
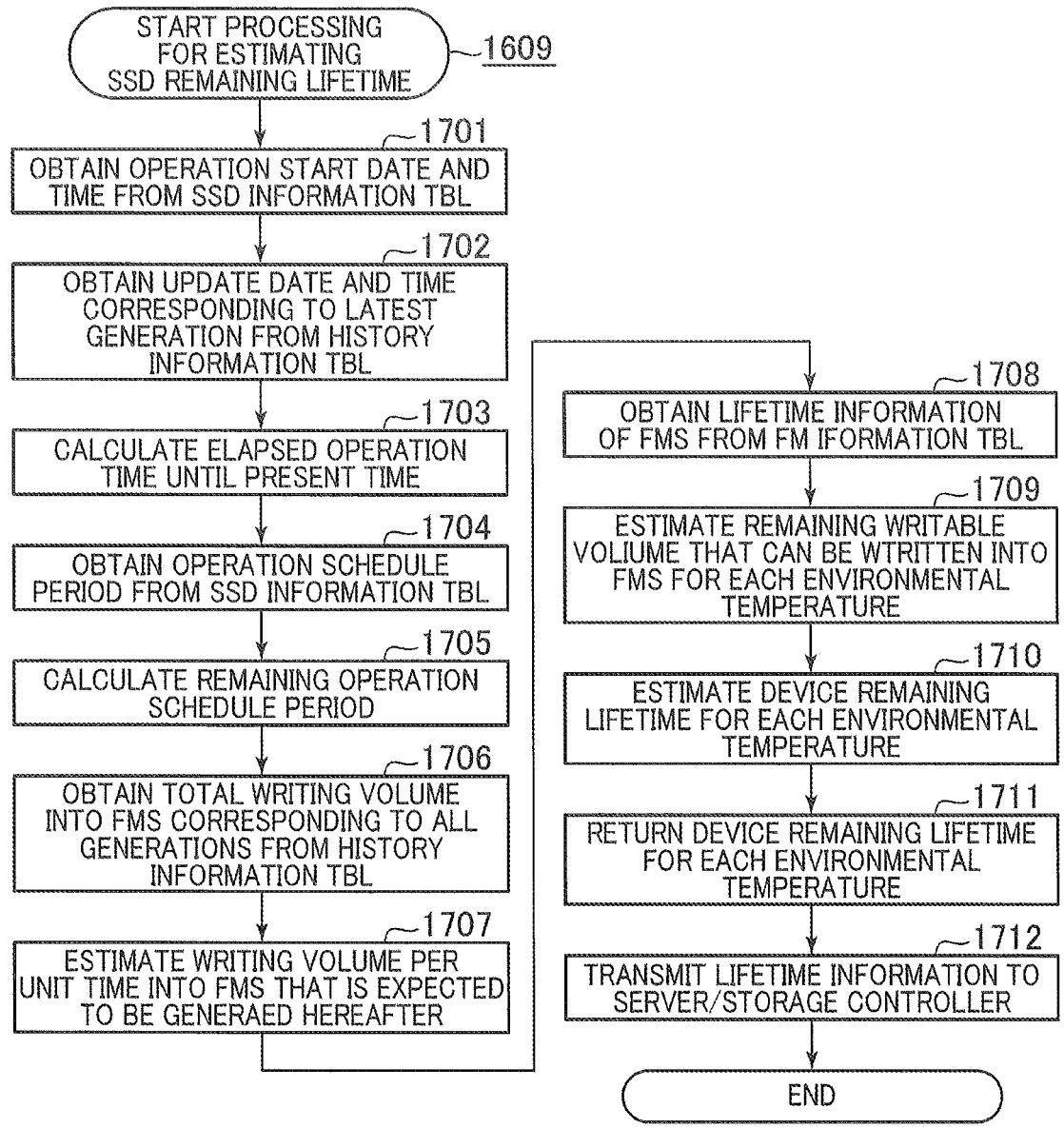
FIG. 17 is a sequence diagram showing an example of a processing flow for estimating the remaining lifetime of an SSD.

FIG. 17 is a sequence diagram showing an example of a processing flow for estimating the remaining lifetime of the SSD 104. The device remaining lifetime estimation program 1105 obtains a value shown by "Operation Start Date and Time" 1408 from the SSD information TBL 1109 (at Step 1701). The device remaining lifetime estimation program 1105 obtains a value shown by "Update Date and Time" 1302 corresponding to the latest generation from the history information TBL 1108 (at Step 1702).

The device remaining lifetime estimation program 1105 calculates an elapsed operation time until the present time using a difference between the value shown by "Operation Start Date and Time" 1408 obtained at Step 1701 and the value shown by "Update Date and Time" 1302 obtained at Step 1702 (at Step 1703). The device remaining lifetime estimation program 1105 obtains a value shown by "Operation Schedule Period" 1407 from the SSD information TBL 1109 (at Step 1704).

The device remaining lifetime estimation program 1105 calculates a remaining operation schedule period using a difference between the elapsed operation time until the present time calculated at Step 1703 and the value shown by "Operation Schedule Period" 1407 obtained at Step 1704 (at Step 1705). The device remaining lifetime estimation program 1105 obtains "Total Writing Volume into FMs" 1304 corresponding to all generations from the first to the latest generation from the history information TBL 1108 (at Step 1706).

The device remaining lifetime estimation program 1105 calculates writing volume per unit time on the basis of the elapsed operation time until the present time calculated at Step 1703 and the value shown by "Total Writing Volume into FMs" 1304 corresponding to all generations obtained at Step 1706. This value can be considered as writing volume per unit time into all the FM chips 1002 that is expected to be generated hereafter (at Step 1707).

It is conceivable that writing volume per unit time expected to be generated hereafter is estimated using the total writing volume until the present time plus the information regarding applications operating on the server/storage controller 105 and the operation information of the I/O processing program 1106 of the SSD 104 as well.

The device remaining lifetime estimation program 1105 obtains information regarding all entries of "Lifetime Information" 1203 from the FM information TBL 1107 (at Step 1708). The device remaining lifetime estimation program 1105 estimates remaining writable volume that can be written into the entirety of all the FM chips 1002 for each environmental temperature on the basis of the information regarding all entries of "Lifetime Information" 1203 obtained at Step 1708 (at Step 1709).

The device remaining lifetime estimation program 1105 determines, for example, remaining writable volume for each environmental temperature per management unit. The device remaining lifetime estimation program 1105 determines the remaining writable volume that can be written into the entirety of all the FM chips 1002 for each environmental temperature on the basis of the least remaining writable volume for each environmental temperature. The remaining writable volume that can be written into the entirety of all the FM chips 1002 is, for example, the product of the remaining writable volume that can be written into management unit and the number of the management units.

The device remaining lifetime estimation program 1105 determines the remaining writable volume for each environmental temperature per management unit from information shown by "Lifetime Information" 1203 corresponding to each management unit using a conversion table or a function held by the SSD 104. The conversion table or the function is experimentally obtained, and is set for the SSD 104 in advance. The conversion table or the function can be prepared for each management unit, or can be prepared in common for the entirety of all the management units.

The device remaining lifetime estimation program 1105 estimates "Device Remaining Lifetime For Each Environmental Temperature" 1305 on the basis of the writing volume per unit time into the entirety of all the FM chips 1002 that is expected to be generated hereafter and estimated at Step 1707, and the remaining writable volume that can be written into the entirety of all the FM chips 1002 for each environmental temperature that is estimated at Step 1709 (at Step 1710).

The device remaining lifetime estimation program 1105 returns the value shown by "Device Remaining Lifetime for Each Environmental Temperature" 1305 estimated at Step 1710 as a result at Step 1609 (at Step 1711). The device remaining lifetime estimation program 1105 creates lifetime information 108 on the basis of information corresponding to the latest generation on the history information TBL 1108, a device information TBL 1110, and "Device Remaining Lifetime for Each Environmental Temperature" 1305 estimated at Step 1710. The device remaining lifetime estimation program 1105 transmits the lifetime information 108 to the server/storage controller 105 via the superior device communication program 1103 (at Step 1712).

The device remaining lifetime estimation program 1105 stores a value shown by "SSD ID" 1410 and a value shown by "Apparatus Model" 1411 that are obtained from the device information TBL 1110 in "SSD ID" 205 and "Apparatus Model" 206 respectively. The device remaining lifetime estimation program 1105 stores a value shown by "Environmental Temperature" shown by the history information TBL 1108 in "Current Environmental Temperature" 209. The device remaining lifetime estimation program 1105 stores a value shown by "Device Remaining Lifetime 1305 at the current environmental temperature in "Current Lifetime" 208.

The device remaining lifetime estimation program 1105 compares the value shown by "Device Remaining Lifetime" 1305 at the current environmental temperature with the remaining operation schedule period calculated at Step 1705. If the value shown by "Device Remaining Lifetime" 1305 is equal to or larger than the remaining operation schedule period, the device remaining lifetime estimation program 1105 stores "Good" in "Lifetime Judgment Result" 207. If the value shown by "Device Remaining Lifetime" 1305 is smaller than the remaining operation schedule period, the device remaining lifetime estimation program 1105 stores "No-Good" in "Lifetime Judgment Result" 207.

The device remaining lifetime estimation program 1105 selects a value of environmental temperature a device remaining lifetime at which is equal to or larger than and the nearest to the remaining operation schedule period among the values of different environmental temperatures shown by "Device Remaining Lifetime" 1305. The device remaining lifetime estimation program 1105 stores the selected value of environmental temperature at "Allowable Environmental Temperature" 210. It is also conceivable that the device remaining lifetime estimation program 1105 calculates an environmental temperature a remaining lifetime at which is equal to the remaining operation schedule period from the function.

If the longest device lifetime among device lifetimes at the different environmental temperature is shorter than the remaining operation schedule period, the device remaining lifetime estimation program 1105 stores "End of Lifetime Is Unavoidable" at "Avoidable Environmental Temperature" 210. In a similar way, if the highest environmental temperature among temperatures the device remaining lifetimes at which is equal to or longer than the remaining operation schedule period is lower than a value shown by "Lowest Allowable Environmental Temperature" 1406, the device remaining lifetime estimation program 1105 stores "End of Lifetime Is Unavoidable" in "Avoidable Environmental Temperature" 210.

Some pieces of the lifetime information 108 can be created by the server/storage controller 105 or the apparatus management device 102 (these devices will be referred to as superior devices hereinafter) instead of the SSD 104. Appropriate aspects can be adopted in accordance with the functions of components in the system and processing loads.

For example, the lifetime information 108 includes "SSD ID" 205, "Current Environmental Temperature" 209, and "Device Remaining Lifetime for Each Environmental Temperature" 1305. Superior devices hold reference information including the SSD information TBL 1109 for determining values shown by "Apparatus Model" 206, "Lifetime Judgment Result" 207, "Current Remaining Lifetime" 208, and "Allowable Environmental Temperature" 210. The superior devices determine values shown by "Lifetime Judgment Result" 207, "Current Remaining Lifetime" 208, and "Allowable Environmental Temperature" 210 on the basis of values shown by "Device Remaining Lifetime for Each Environmental Temperature" 1305 and the reference information.

In addition, the present invention is not limited to the above embodiment, and the present invention may include various kinds of modification examples. For example, the above embodiment has been described in detail in order to explain the present invention in an easily understood manner, and the present invention is not necessarily limited to the embodiment which includes all configurations that have been described so far. Furthermore, a part of the configuration of one embodiment can be replaced with a part of the configuration of another embodiment. It is also possible to add the configuration of one embodiment to the configuration of another embodiment. In addition, a new embodiment of the present invention may be made by deleting a part of the configuration of each embodiment, by adding another configuration to a part of the configuration of each embodiment, or by replacing a part of configuration of each embodiment with another configuration.

Furthermore, it is conceivable that part or the entirety of each of the above-described configurations, functions, processing units and the like is realized by hardware, for example, through designing the part or entirety using integrated circuits. Alternatively, it is also conceivable that the above-described configurations, functions, and the like are realized by software through the operations of processors in which the processors interpret programs, which realize the respective functions, and executes the programs. Information included in the programs, tables, and files that realize the above-described various functions can be stored in recording media such as memories, hard disks, and SD cards.

In addition, in this specification, control lines and information lines are shown in the case where they are indispensable for explaining this embodiment, and therefore all control lines and information lines necessary in the case of materializing this embodiment as a product are not shown. It is conceivable that in reality almost all components are interconnected.

The invention claimed is:
1. A system, comprising:
a plurality of storage drives including a first storage drive;
a superior device superior to the first storage drive; and
an environmental temperature adjusting device that adjusts the environmental temperatures of the plurality of storage drives,
wherein the superior device:
specifies a first allowable environmental temperature that makes the remaining lifetime of the first storage drive longer than the remaining operation schedule period of the first storage drive; and
controls the environmental temperature adjusting device to adjust the environmental temperature of the first storage drive on the basis of the first allowable environmental temperature,
wherein, if the remaining lifetime of the first storage drive at a predefined environmental temperature is shorter than the remaining operation schedule period of the first storage drive, the superior device:
determines a cost in a first operation in which the environmental temperature adjusting device is controlled on the basis of the first allowable environmental temperature without replacing the first storage drive;
determines a cost in a second operation in which the environmental temperature adjusting device is controlled on the basis of a temperature equal to or higher than the predefined environmental temperature with replacing the first storage drive; and
selects a more inexpensive one of the first operation and the second operation.

2. The system according to claim 1,
wherein the predefined environmental temperature is a current environmental temperature measured by the first storage drive.

3. A method for controlling the environmental temperature of one storage drive or the environmental temperatures of a plurality of storage drives, comprising:
specifying a first allowable environmental temperature that makes the remaining lifetime of a first storage drive longer than the remaining operation schedule period of the first storage drive; and
controlling an environmental temperature adjusting device that adjusts the environmental temperature of the first storage drive on the basis of the first allowable environmental temperature,
wherein the first storage drive is included among a plurality of storage drives, and the environmental temperature adjusting device adjusts the environmental temperatures of the plurality of storage drives, and
the method comprising:
specifying allowable environmental temperatures of the plurality of storage drives, each of the allowable environmental temperatures making the remaining lifetime of each of the plurality of storage drives equal to or longer than the remaining operation schedule period of each of the plurality of storage drives; and
controlling the environmental temperature adjusting device on the basis of the lowest allowable environmental temperature among the allowable environmental temperatures.

4. The method according to claim 3,
wherein, if the remaining lifetime of the first storage drive at a predefined environmental temperature is shorter than the remaining operation schedule period of the first storage drive, the method comprising:
determining a first cost in an operation in which the environmental temperature adjusting device is controlled on the basis of the first allowable environmental temperature without replacing the first storage drive;
determining a second cost in an operation in which the environmental temperature adjusting device is controlled on the basis of a temperature equal to or higher than the predefined environmental temperature with replacing the first storage drive; and
selecting a more inexpensive one of the first cost and the second cost.

5. The method according to claim 4,
wherein the predefined environmental temperature is a current temperature measured by the first storage drive, and
the temperature equal to or higher than the predefined environmental temperature is the lowest allowable environmental temperature of the allowable environmental temperatures of the plurality of storage drives other than the first storage drive.

6. The method according to claim 3,
wherein, if the first allowable environmental temperature is lower than the lowest operable temperature preset to the first storage drive, information that recommends the replacement of the first storage drive is proposed in a display device.

7. The method according to claim 3,
wherein the allowable environmental temperature of each of the plurality of storage devices is the highest environmental temperature that satisfies a condition for the remaining lifetime of each storage device to be equal to or longer than the remaining operation schedule period of each storage device.

8. A system, comprising:
a plurality of storage drives including a first storage drive;
a superior device superior to the first storage drive; and
an environmental temperature adjusting device that adjusts the environmental temperatures of the plurality of storage drives,
wherein the superior device:
specifies allowable environmental temperatures of the plurality of storage drives, each of the allowable environmental temperatures making the remaining lifetime of each of the plurality of storage drives equal to or longer than the remaining operation schedule period of each of the plurality of storage drives,
controls the environmental temperature adjusting device on the basis of the lowest allowable environmental temperature among the allowable environmental temperatures,
specifies a first allowable environmental temperature that makes the remaining lifetime of the first storage drive longer than the remaining operation schedule period of the first storage drive, and
controls the environmental temperature adjusting device to adjust the environmental temperature of the first storage drive on the basis of the first allowable environmental temperature.

9. The system according to claim 8,
wherein the first storage drive determines the first allowable environmental temperature on the basis of the history of writing volume into the first storage drive,
the superior device obtains first information showing the first allowable environmental temperature from the first storage drive, and
specifies the first allowable environmental temperature with reference to the first information.

10. The system according to claim 8,
wherein each of the plurality of storage drives determines the allowable environmental temperature of each of the plurality storage drive on the basis of the history of writing volume into each of the plurality storage drives,
the superior device obtains second information showing the allowable environmental temperature from each of the plurality of storage drives, and
specifies the allowable environmental temperature of each of the plurality storage drives with reference to the second information.

11. The system according to claim 8,
wherein, if the remaining lifetime of the first storage drive at a predefined environmental temperature is shorter than the remaining operation schedule period of the first storage drive,
the superior device determines a first cost in an operation in which the environmental temperature adjusting device is controlled on the basis of the first allowable environmental temperature without replacing the first storage drive,
determines a second cost in an operation in which the environmental temperature adjusting device is controlled on the basis of a temperature equal to or higher than the predefined environmental temperature with replacing the first storage drive, and
selects a more inexpensive one of the first cost and the second cost.

12. The system according to claim 11,
wherein the predefined environmental temperature is a current environmental temperature measured by the first storage drive.

13. The system according to claim 12,
wherein the first storage drive determines the remaining lifetime of the first storage drive at the current environmental temperature on the basis of the history of the writing volume into the first storage drive, and generates information showing the comparison result of the remaining lifetime with the remaining operation schedule period, and the superior device judges whether or not the remaining lifetime of the first storage drive at the predefined environmental temperature is shorter than the remaining operation schedule period of the first storage drive with reference to information showing the comparison result obtained from the first storage drive.

\* \* \* \* \*